United States Patent [19]

Nishimura

[11] Patent Number: 5,302,101
[45] Date of Patent: Apr. 12, 1994

[54] MOLD FOR RESIN-PACKAGING ELECTRONIC COMPONENTS

[75] Inventor: Hiroyuki Nishimura, Kyoto, Japan
[73] Assignee: Rohm Co., Ltd., Kyoto, Japan
[21] Appl. No.: 7,381
[22] Filed: Jan. 21, 1993

Related U.S. Application Data

[62] Division of Ser. No. 796,799, Nov. 25, 1991, abandoned.

[30] Foreign Application Priority Data

Jan. 9, 1991 [JP] Japan .................................. 3-12927

[51] Int. Cl.⁵ ...................... B29C 45/02; B29C 45/14; B29C 45/32
[52] U.S. Cl. ...................................... 425/116; 425/121; 425/129.1; 425/544; 425/588; 425/DIG. 228; 264/272.17
[58] Field of Search ............ 425/116, 588, 564, 129.1, 425/121, 192 R, DIG. 228; 264/272.17; 249/95

[56] References Cited

U.S. PATENT DOCUMENTS

| | | | |
|---|---|---|---|
| 3,184,030 | 5/1965 | Ludwig | 425/129.1 |
| 3,779,506 | 12/1973 | Adams | 425/572 |
| 4,453,903 | 6/1984 | Pukaite | 425/572 |
| 4,511,317 | 4/1985 | Bandoh | 425/544 |
| 4,599,062 | 7/1986 | Konishi | 264/272.17 |
| 4,946,633 | 8/1990 | Saeki et al. | 264/272.17 |
| 5,071,334 | 12/1991 | Obara | 425/588 |
| 5,139,728 | 8/1992 | Baird | 264/272.11 |
| 5,158,780 | 10/1992 | Schraven et al. | 425/116 |

FOREIGN PATENT DOCUMENTS

2-25253 6/1990 Japan .

*Primary Examiner*—Khanh Nguyen
*Attorney, Agent, or Firm*—William H. Eilberg

[57] ABSTRACT

A mold for resin-packaging electronic components on a pair of leadframes includes an upper mold member and a lower mold member. The mold has two parallel rows of molding cavities, and a row of resin supplying portions arranged between the respective cavity rows. The respective molding cavities have corresponding corner portions formed with injection ports which communicate with the respective resin supplying portions through runners. The respective cavity rows together with the leadframes received in the mold are displaced relative to each other longitudinally thereof by a predetermined amount.

5 Claims, 4 Drawing Sheets

MOLD FOR RESIN-PACKAGING ELECTRONIC COMPONENTS

This application is a division of application Ser. No. 07/796,799, filed on Nov. 25, 1991 now abandoned.

BACKGROUND OF THE INVENTION

1. Field of the Invention

This invention relates to an improved method for simultaneously resin-packaging electronic components on a pair of leadframes. The present invention also relates to an improved mold used in such a method.

2. Description of the Prior Art

Generally, electronic components such as IC's and transistors are produced by using leadframes. Specifically, semiconductor chips are first mounted on the leadframe at constant spacing, and subsequently packaged in synthetic resin. After hardening of the resin, the packaged electronic components are separated from the leadframe.

Conventionally, the so-called multi-molding technique has been often adopted for resin-packaging electronic components simultaneously with respect to a pair of leadframes. According to such a technique, use is made of a specific mold such as shown in FIGS. 4 and 5.

Specifically, as shown in FIGS. 4 and 5, the prior art mold, which is generally designated by reference numeral 10, consists of a lower mold member 20 and a upper mold member 30. The upper and lower mold members together form two rows of molding cavities C10, C20. The two cavity rows are spaced transversely from but arranged in parallel to each other. Further, each molding cavity in each row is aligned with a corresponding molding cavity in the other row.

The lower mold member 20 has a central row of resin loading chambers 40 arranged at suitable spacing between the respective cavity rows C10, C20. Each loading chamber 40 receives a load of synthetic resin material such as a resin tablet 50, and a plunger 60 is slidably inserted in the loading chamber. Further, the resin loading chamber 40 communicates with a pair of runners 70, 80 which, in turn, communicate respectively with two molding cavities C10, C20 of the respective cavity rows through injection ports 70a, 80a.

In use of the mold 10 for multi-molding, a first leadframe R10 and a second leadframe R20 are arranged in parallel to each other between the respective mold members 20, 30. Thereafter, the respective resin tablets 50 are melted under heating, and the plungers 60 are pushed in deeper for supplying the fluidized resin into the molding cavities C10, C20 through the runners 70, 80 and the injection ports 70a, 80a. As a result, the electronic components E10, E20 carried on the leadframes are packaged in the resin.

Normally, the respective leadframe R10, R20 have specific orientation or directivity because the circuit arrangement on each electronic component E10, E20 is not symmetrical. Thus, the resin injection ports 70a, 80a for all of the molding cavities C10, C20 must be located at corresponding corner portions with respect to the electronic components E10, E20 in order to provide uniform quality for all of the products.

Further, the respective leadframes R10, R20, which are located on both sides of the row of resin loading chambers 40, must be arranged in opposite orientation. Specifically, as shown in FIG. 4, the first leadframe R10 is made to have its leading and trailing edges R10a, R10b located oppositely to those R20a, R20b of the second leadframe R20. It should be appreciated that the terms "leading edge" and "trailing edge" are used here only for the convenience of indicting the specific orientation of the leadframe in relative sense but not in absolute sense.

As a result, the respective runners 70, 80 must be inclined to a great degree relative to a line PL which is perpendicular to the longitudinal direction of the leadframes R10, R20. Thus, the runners become inevitably long, consequently necessitating the use of slow-hardening resin for packaging the electronic components E10, E20. For this reason, the productivity of the prior art method is relatively low, and the production cost increases.

Moreover, when each resin loading chamber 40 is commonly used for supplying resin to four molding cavities C10, C20, two kinds of runners 70', 70", 80', 80" must be provided which are different in length, as shown in FIG. 6. In this case, not only one kind of runners 70", 80' become unacceptably long, but also the difference in length between the runners results in uneven quality of the products.

SUMMARY OF THE INVENTION

It is, therefore, an object of the invention to provide an improved multi-molding method which is capable of simultaneously resin-packaging a plurality of electronic components on a pair of leadframes at lower cost and with more uniform quality than conventionally possible.

Another object of the present invention is to provide a mold which is advantageously used for carrying out the improved multi-molding method.

According to one aspect of the invention, there is provided a method for resin-packaging electronic components on a pair of leadframes by using a mold which includes an upper mold member and a lower mold member, the mold having two parallel rows of molding cavities, the mold further having a row of resin supplying portions between the respective cavity rows, the respective molding cavities having corresponding corner portions formed with injection ports which communicate with the respective resin supplying portions through runners, the method comprising the steps of: placing the respective leadframes between the upper and lower mold members in corresponding relation to the respective cavity rows so that the electronic components of the respective leadframes are located within the respective rows of molding cavities, one of the leadframes being oriented longitudinally opposite to the other leadframe; and causing fluid resin to flow from the respective resin supplying portions into the respective molding cavities through the runners and injection ports; wherein the respective leadframes are displaced relative to each other longitudinally thereof by a predetermined amount.

In a preferred embodiment of the present invention, the number of the resin supplying portions is equal to that of the molding cavities in each cavity row, and the respective runners are made to extend perpendicularly to the respective leadframes. In this embodiment, the runners can be rendered shortest, so that the method of the invention can utilize much faster-hardening resin than the prior art method. Thus, the time required for hardening the resin is reduced to increase the productivity, which leads to cost reduction.

In another preferred embodiment, the number of the resin supplying portions is half that of the molding cavities in each cavity row, and the runners are made to extend obliquely relative to the respective leadframes and have an equal length. Because of this arrangement, all of the runners are equal in length, so that all of the packaged electronic components are made to have substantially uniform quality.

According to another aspect of the present invention, there is provided a mold for resin-packaging electronic components on a pair of leadframes comprising an upper mold member and a lower mold member, the mold having two parallel rows of molding cavities, the mold further having a row of resin supplying portions between the respective cavity rows, the respective molding cavities having corresponding corner portions formed with injection ports which communicate with the respective resin supplying portions through runners, wherein the respective cavity rows are displaced relative to each other longitudinally thereof by a predetermined amount.

Other objects, features and advantages of the present invention will be fully understood from the following detailed description given with reference to the accompanying drawings.

DETAILED DESCRIPTION

Figure 1:
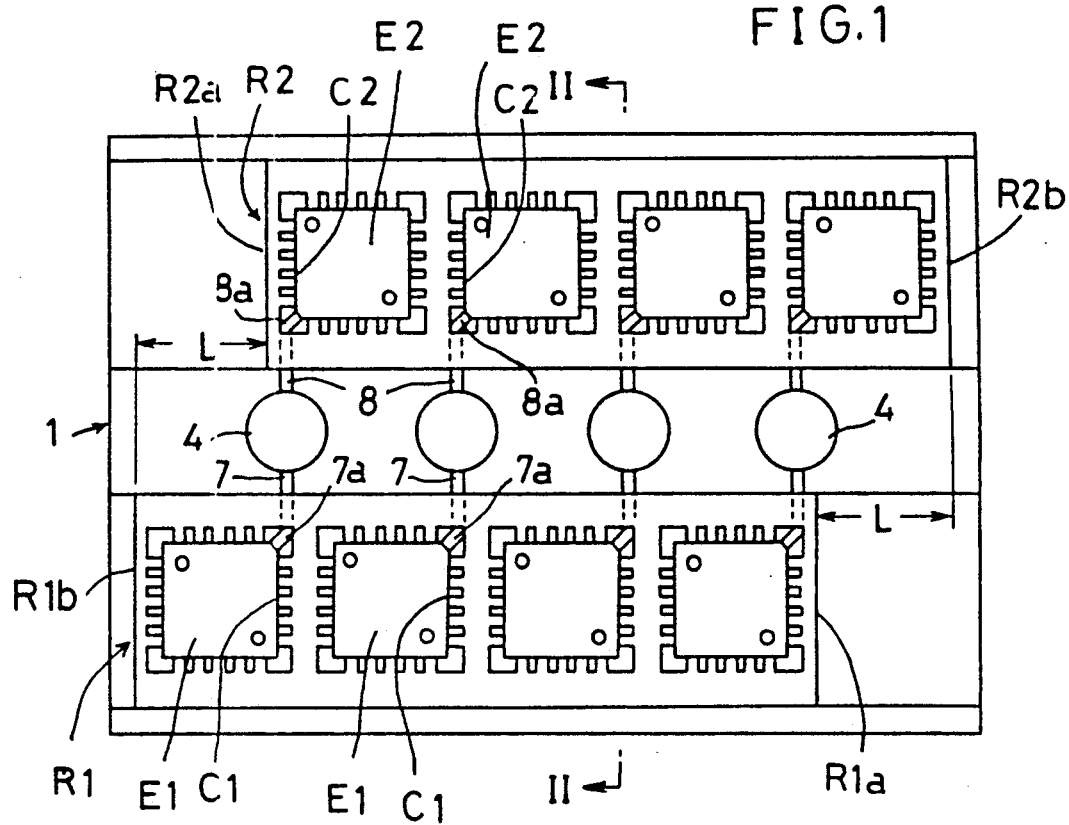
FIG. 1 is a plan view showing a mold used in a method according to a first embodiment of the present invention.
Figure 2:
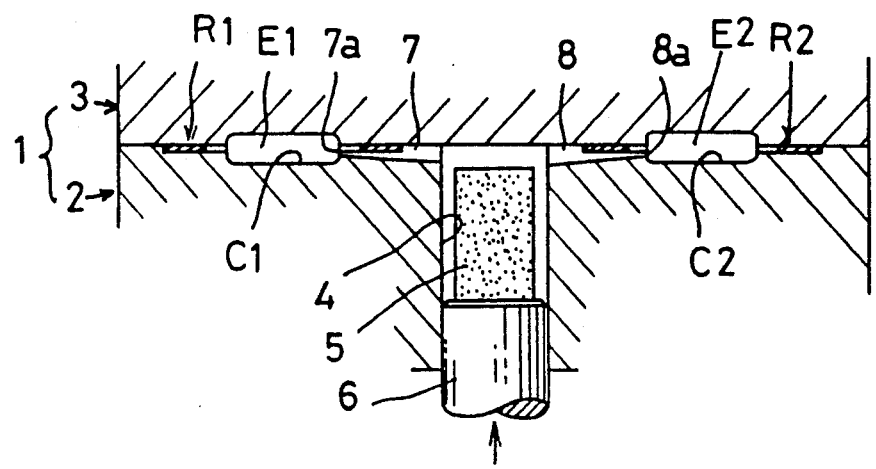
FIG. 2 is a sectional view taken along lines II—II in FIG. 1.

Referring first to FIGS. 1 and 2 showing a first embodiment of the present invention, there is illustrated a mold 1 consisting of a lower mold member 2 and an upper mold member 3. A first leadframe R1 and a second leadframe R2 are arranged in parallel to each other between the respective mold members 2, 3. The respective leadframes carry electronic components E1, E2 which are subsequently molded or packaged in protective synthetic resin.

The two mold members 2, 3 together form two rows of molding cavities C1, C2. The two cavity rows are spaced from each other transversely of the leadframes R1, R2. Further, in accordance with the present invention, the respective rows of molding cavities C1, C2 are displaced from each other longitudinally of the leadframes.

The lower mold member 2 has a central row of resin loading chambers 4 arranged at suitable spacing longitudinally of the leadframes R1, R2. Each loading chamber 4 receives a load of synthetic resin material such as a resin tablet 5, and a plunger 6 is slidably inserted in the loading chamber.

In the embodiment of FIGS. 1 and 2, each resin loading chamber 4 communicates with a pair of runners 7, 8 which, in turn, communicate respectively with two molding cavities C1, C2 of the respective cavity rows through injection ports 7a, 8a. The respective runners 7, 8 extend perpendicularly to the longitudinal direction of the leadframes R1, R2, whereas the respective injection ports 7a, 8a are located at corresponding corners of the respective molding cavities C1, C2.

As shown in FIG. 1, the first leadframe R1 has its leading and trailing edges R1a, R1b located oppositely to those R2a, R2b of the second leadframe R2. Thus, the first and second leadframes R1, R2 are opposite in orientation. It should be appreciated that the terms "leading edge" and "trailing edge" as used here have the same meanings as previously described in connection with the prior art.

Further, because of the longitudinal displacement between the respective cavity rows C1, C2, the first leadframe R1 is also displaced longitudinally relative to the second leadframe R2 by an amount L, as shown in FIG. 1. As a result, the injection ports 7a for one cavity row C1 can be brought closest to those 8a for the other cavity row C2, so that the length of the respective runners 7, 8 can be made shortest.

In use of the mold 1, the respective resin tablets 5 are melted by heating, and the respective plungers 6 are inserted deeper into the loading chambers 4. As a result, the fluidized resin enters into the respective molding cavities C1 to package the electronic components E1, E2.

Figure 4:
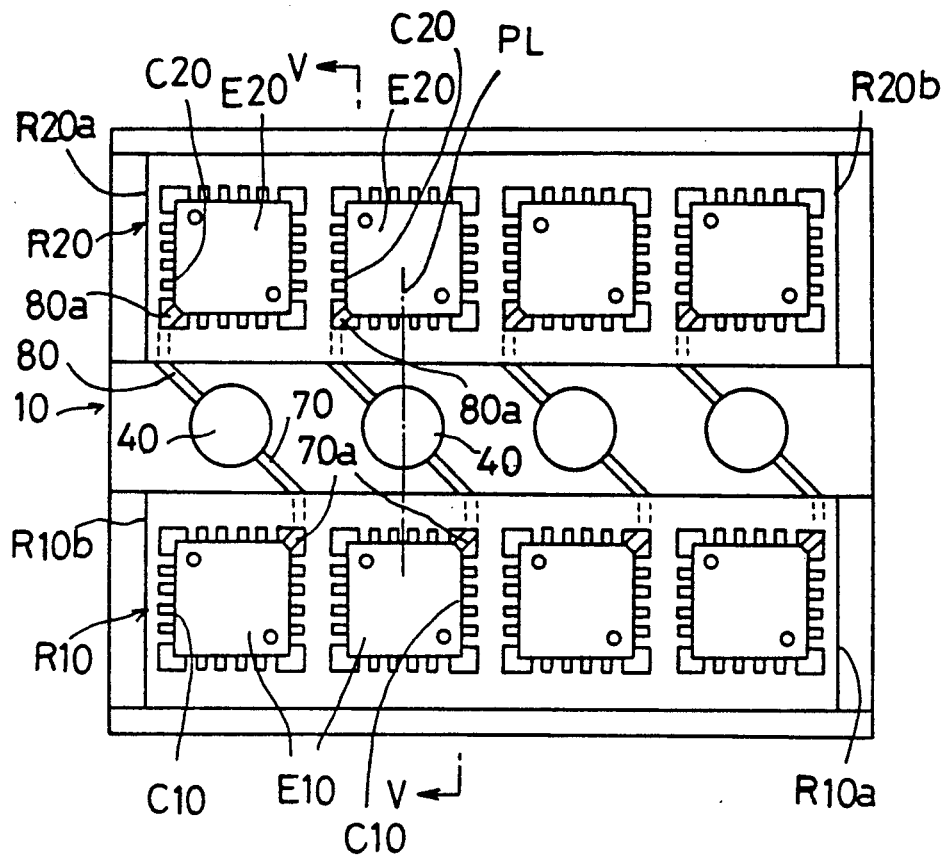
FIG. 4 is a plan view showing a mold used in a prior art method.
Figure 5:
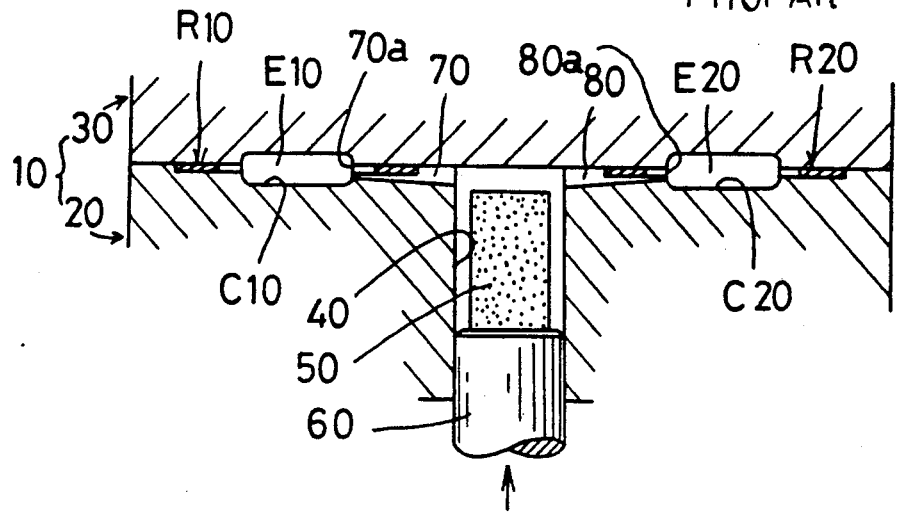
FIG. 5 is a sectional view taken along lines V—V in FIG. 4.
Figure 6:
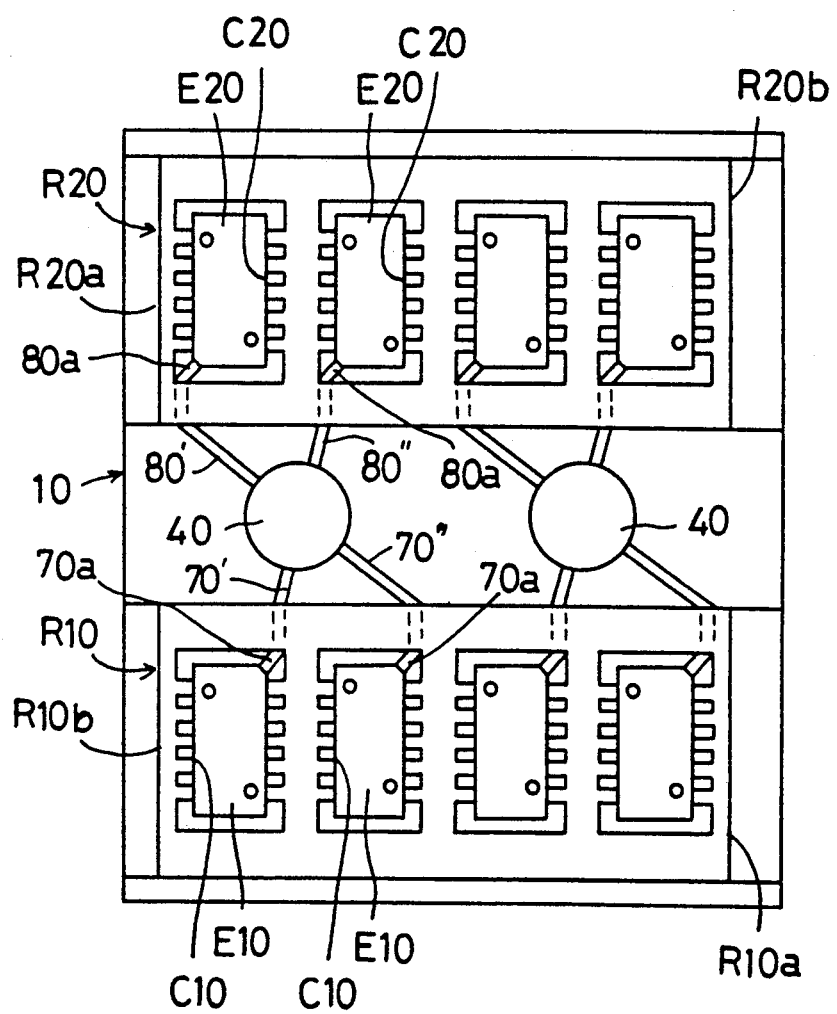
FIG. 6 is a plan view showing a mold used in another prior art method.

Obviously, according to the first embodiment of the present invention, the respective runners 7, 8 are rendered much shorter than those of the prior art shown in FIGS. 4 and 5. Thus, it is possible to utilize faster-curing resin, thereby shortening the time required for hardening the resin. Further, the shortened runners 7, 8 reduces the resistance against resin flow, so that a lower pressure is required for injection of the resin into the respective molding cavities.

In the embodiment of FIGS. 1 and 2, the respective leadframes R1, R2 (i.e., the respective molding cavity rows C1, C2) are displaced longitudinally relative to each other by such an amount L that the injection ports 7a, 8a for the respective cavity rows C1, C2 are closest to each other with the runners 7, 8 extending perpendicularly to the leadframes. However, the displacing amount L may be varied depending on various requirements, and the runners 7, 8 may be made to extend obliquely at a smaller angle than conventionally possible.

Figure 3:
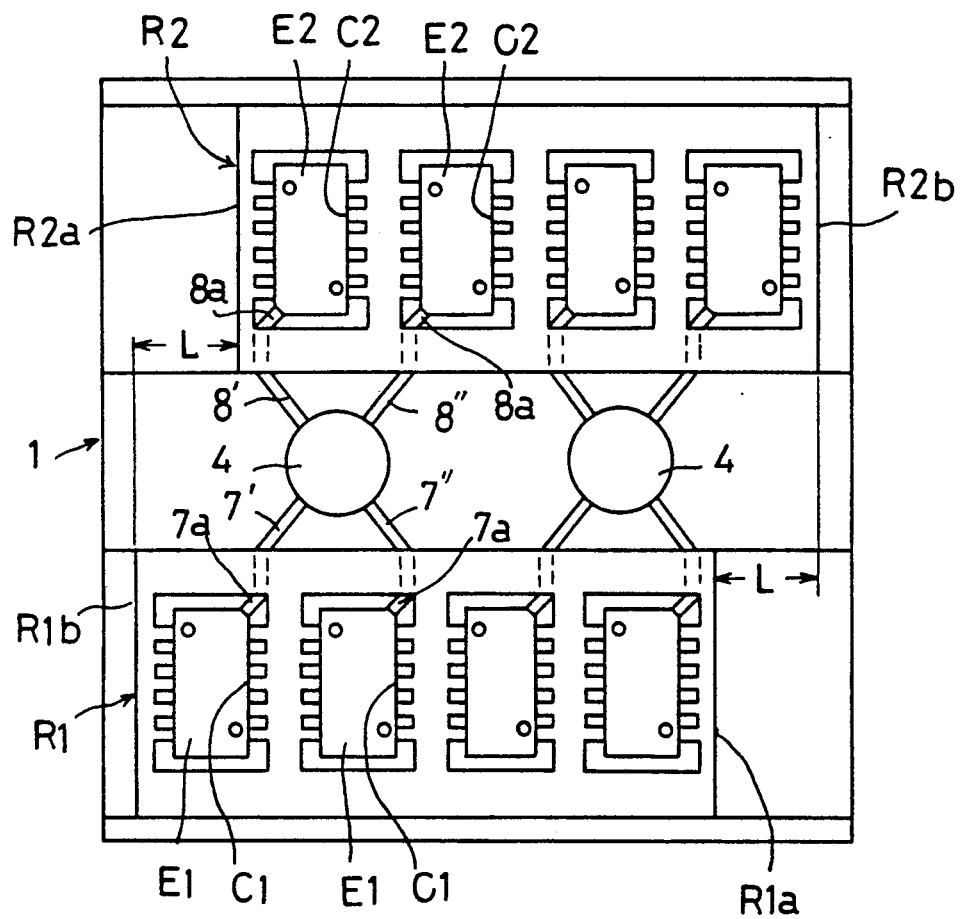
FIG. 3 is a plan view showing a mold used in a method according to a second embodiment of the present invention.

FIG. 3 shows a second embodiment of the present invention which is substantially the same as the first embodiment except for the following points.

First, the mold 1 according to the second embodiment has a smaller number of resin loading chambers 4 than the mold of the first embodiment. Thus, each resin loading chamber is commonly used to supply resin to four molding cavities C1, C2.

Secondly, the respective loading chambers 4 are made to communicate with the molding cavities through runners 7', 7", 8', 8" which extend obliquely and are equal in length.

According to the second embodiment, since the respective runners 7', 7", 8', 8" are all equal in length, the fluidized resin flows through the runners without time difference. As a result, all of the packaged or molded electronic components E1, E2 are equalized in quality.

The invention being thus described, it is obvious that the same may be varied in many ways. For instance, instead of the lower mold member 2, the upper mold member 3 may be formed with resin loading chambers, runners and injection ports. Further, instead of using resin tablets 5 which are subsequently subjected to thermal-melting, fluid resin may be introduced from outside the mold 1 under pressure without using the plungers 6. Such variations are not to be regarded as a departure from the spirit and scope of the invention, and all such modifications as would be obvious to those skilled in the art are intended to be included within the scope of the following claims.

I claim:

1. A mold for resin-packaging electronic components on a pair of leadframes comprising:

an upper mold member and a lower mold member, the mold having a plurality of molding cavities, the molding cavities being arranged in first and second rows, the first and second rows being parallel to each other, each of said rows having a longitudinal axis, wherein for each cavity in the first row there is a corresponding cavity in the second row, wherein each cavity in the first row is longitudinally offset relative to the corresponding cavity in the second row, the mold further having a row of resin supplying portions between said first and second rows of cavities, the cavities having corner portions formed with injection ports which communicate with the resin supplying portions through runners, wherein the injection ports are arranged such that a line joining an injection port of a cavity in the first row with an injection port of the corresponding cavity in the second row is perpendicular to the longitudinal axes of the first and second rows, and wherein all of the runners are of equal length.

2. The mold according to claim 1, wherein the number of the resin supplying portions is equal to that of the molding cavities in each of said rows, the runners extending perpendicularly to the leadframes.

3. The mold according to claim 1, wherein the number of the resin supplying portions is half that of the molding cavities in each of said rows, the runners being inclined relative to the leadframes.

4. The mold according to claim 1, wherein each cavity in the first row is longitudinally offset relative to the corresponding cavity in the second row by an amount substantially corresponding to a longitudinal dimension of one of said cavities.

5. The mold according to claim 1, wherein the resin supplying portions of the mold are in the form of resin loading chambers each slidably receiving a plunger.

* * * * *